(12) United States Patent
Monro

(10) Patent No.: US 7,889,933 B2
(45) Date of Patent: Feb. 15, 2011

(54) DATA COMPRESSION USING MATCHING PURSUITS

(75) Inventor: Donald M. Monro, Bath (GB)

(73) Assignee: Ayscough Visuals LLC, Las Vegas, NV (US)

(*) Notice: Subject to any disclaimer, the term of this patent is extended or adjusted under 35 U.S.C. 154(b) by 1233 days.

(21) Appl. No.: 10/585,497

(22) PCT Filed: Jan. 7, 2005

(86) PCT No.: PCT/US2005/000612

§ 371 (c)(1),
(2), (4) Date: Jul. 6, 2006

(87) PCT Pub. No.: WO2005/067661

PCT Pub. Date: Jul. 28, 2005

(65) Prior Publication Data

US 2009/0190842 A1    Jul. 30, 2009

(30) Foreign Application Priority Data

Jan. 8, 2004    (GB)    ................. 0400334.9

(51) Int. Cl.
G06K 9/36 (2006.01)
(52) U.S. Cl. .................................. 382/232
(58) Field of Classification Search ............ 382/232
See application file for complete search history.

(56) References Cited

U.S. PATENT DOCUMENTS

| 5,648,987 | A  | * | 7/1997  | Yang et al. ............... 375/232    |
| 5,699,121 | A  |   | 12/1997 | Zakhor et al. ........... 375/240.17   |
| 6,393,393 | B1 | * | 5/2002  | Kawahara ................ 704/229      |
| 6,535,555 | B1 | * | 3/2003  | Bordes et al. ........... 375/240.04   |
| 7,006,567 | B2 |   | 2/2006  | Frossard et al.                        |
| 2003/0031369 | A1 |   | 2/2003 | Le Pennec et al. ....... 382/282     |
| 2003/0179901 | A1 | * | 9/2003 | Tian et al. ............... 382/100    |
| 2003/0228068 | A1 | * | 12/2003 | Dhavala et al. ......... 382/281     |
| 2005/0163216 | A1 | * | 7/2005 | Boon et al. ............. 375/240.12   |

FOREIGN PATENT DOCUMENTS

| EP | 0 822 944 | 8/1999 |
| EP | 0 933 943 | 8/1999 |

OTHER PUBLICATIONS

Banham, M.R.; Brailean, J.C., "A selective update approach to matching pursuits video coding," Circuits and Systems for Video Technology, IEEE Transactions on, vol. 7, No. 1, pp. 119-129, Feb. 1997.*

(Continued)

*Primary Examiner*—Bhavesh M Mehta
*Assistant Examiner*—Nirav G Patel
(74) *Attorney, Agent, or Firm*—Woodcock Washburn LLP

(57) ABSTRACT

A method and apparatus for data compression comprises applying a decorrelating transform to multi-dimensional data to be compressed, then using a sequence of one or more one-dimensional matching pursuits algorithms to code the output of the transform. The invention finds particular application in video and still image coders, particularly real-time coders, those intended for use at very low bit rates, and those for which scalable bit rates are of importance.

53 Claims, 6 Drawing Sheets

OTHER PUBLICATIONS

Banham, M.R., "A Selective Update Approach to Matching Pursuits Video Coding," *IEEE Transaction on Circuits and Systems for Video Technology*, 1997, 7(1), 119-129.

Mallat, S.G., "Matching Pursuits with Time-Frequency Dictionaries," *IEEE Transactions on Signal Processing*, Dec. 1993, 41, 3397-3408.

Neff et al., "Very low bit rate video coding based on Matching Pursuits," *IEEE Transactions on Circuits and Systems for Video Technology*, Oct. 1997, 7(5), 158-171.

Rezaiifar et al., "Wavelet Based Speech Coding Using Orthogonal Matching Pursuit," *Proc. 29$^{th}$ Int. Conf on Information Systems (CISS-95)*, Mar. 1995, 88-92.

Vetterli, M., "Matching Pursuit for Compression and Application to Motion Compensated Video Coding," *IEEE International Conference Proceedings ICIP-94*, Nov. 1994, 1(13-16), 725-729.

Alparone, L. et al., "Matching Pursuit Analysis of Hyperspectral Imagery," *Proceedings of SPIE*, 2003, 5207, 521-530.

European Application No. 05705327.4: Supplemental European Search report dated Oct. 20, 2010, 4 pages.

Lui, et al., "Improvement of Encoder for Matching-Pursuit-Based Video Coding," Electronics Letters 36(6), IEE Stevenage, Mar. 16, 2000, pp. 548-549.

Marusic, et al., "A Matching Pursuit Enhanced Three-Dimensional Wavelet Transform Coder," 10$^{th}$ Mediterranean Electrotechnical Conference, Melecon, vol. II, May 29-31, 2000 , pp. 482-485.

Monro, "Basis Picking for Matching Pursuits Image Coding," 2004 International Conference on Image Processing (ICIP) vol. 4, Oct. 24-27, 2004, pp. 2495-2498.

Neff, et al., "Matching Pursuit Video Coding at Very Low Bit Rates," Proceedings of Data Compression Conference, IEEE Computer Society Press, Mar. 28, 1995, pp. 411-420.

Neff, et al., "Very Low Bit-Rate Video Coding Based on Matching Pursuits," IEEE Transactions on Circuits and Systems for Video Technology 7(1), Feb. 1, 1997, 14 pages.

Rabiee, et al., "Scalable Subband Image Coding with Segmented Orthogonal Matching Pursuit," IEEE Computer Soc., International Confererice on Chicago, Oct. 4, 1995, pp. 774-777.

* cited by examiner

DATA COMPRESSION USING MATCHING PURSUITS

CROSS-REFERENCE TO RELATED APPLICATIONS

This application is the National Phase of International Application No. PCT/US2005/00612, filed Jan. 7, 2005, which claims the benefit of Great Britain Patent Application No. 0400334.9, filed Jan. 8, 2004, the disclosures of which are incorporated herein by reference in their entirety.

The present invention relates to data compression techniques, and in particular to techniques which use the matching pursuits algorithm. The invention is particularly although not exclusively applicable to the field of video and still image compression.

The transform known as matching pursuits was introduced by Mallat & Zang, in their paper "Matching Pursuits with Time-Frequency Dictionaries", IEEE *Transactions on Signal Processing*, volume 41, 12 Dec. 1993. A significant amount of research has been carried out subsequent to publication of that paper with a view to applying the matching pursuits algorithm to the compression of video images and audio data, as exemplified by Neff & Zakhor, "*Very low bit rate video coding based on Matching Pursuits*", IEEE *Transactions on Circuits and Systems for Video Technology*, volume 7, number 5, October 1997, pages 158-171; see also their U.S. Pat. No. 5,699,121. While the transform has proved extremely effective, its practical application has been limited, primarily because it requires a large amount of computation and is therefore relatively slow. Conventional thinking is that the transform is unlikely to be useable in practical real-time video coding systems for some years to come, until the transform has been sufficiently optimised or hardware speeds sufficiently increased. One approach however, that has suggested using matching pursuits in the content of the encoding of speech is that described by Rezaiifar and Jafarkhani in their paper "*Wavelet Based Speech Coding Using Orthogonal Matching Pursuit*", Proc. $29^{th}$ Int. Conf. on Information Systems (CISS-95), pp 88-92, March 1995.

The invention also dispels controversial thinking matching pursuit must always be computationally intensive.

According to one aspect of the invention there is provided a method of data compression comprising applying a transform to multi-dimensional data to generate a multi-dimensional transform data set, and coding the transform data set by applying one or more one-dimensional matching pursuits algorithms.

Preferably, a plurality of one-dimensional matching pursuits algorithms are used, each in a different scanning direction through the data. The scan directions may (but need not) be orthogonal. There may be a single one-dimensional matching pursuits algorithm per dimension of the data, or there may be fewer: in other words we may use one or more matching pursuits algorithms up to the number of dimensions of the data.

According to another aspect of the invention there is provided a method of data compression comprising:
(a) applying a transform to multi-dimensional data to generate a multi-dimensional transform data set;
(b) convolving the transform data set with each of a plurality of first one-dimensional basis functions to generate a corresponding plurality of convolved data sets;
(c) determining a location in a first direction across all the convolved data sets, and a first basis function, representative of a greatest magnitude;
(d) convolving the transform data at the said location with each of a plurality of second one-dimensional basis functions;
(e) determining a second basis function representative of a greatest magnitude;
(f) representing part of the transform data surrounding the said location with an atom derived from the first and second basis functions corresponding to the greatest determined magnitudes;
(g) subtracting the atom from the transform data set to create a new data set;
(h) repeatedly updating the convolved data sets by convolving any changed part of the transform data set with each of the plurality of first one-dimensional basis functions, and then re-applying steps (c) to (f); and
(i) outputting as quantized transform data coded versions of the atoms derived at step (f).

According to another aspect there is provided a method of data compression comprising:
(a) applying a transform to multi-dimensional data to generate a multi-dimensional transform data set;
(b) convolving the transform data set with each of a plurality of first one-dimensional basis functions to generate a corresponding plurality of convolved data sets;
(c) determining a first location in a first direction across all the convolved data sets, and a first basis function representative of a greatest magnitude; and representing part of the transform data surrounding the first location with a first atom derived from the first function corresponding to the greatest determined magnitude;
(d) subtracting the first atom from the transform data set to create a new data set;
(e) convolving the new data set with each of a plurality of second one-dimensional basis functions;
(f) determining a second location in a second direction across all the convolved data sets, and a second basis function representative of a greatest magnitude; and representing part of the new data set surrounding a second location with a second atom derived from the second function corresponding to the greatest determined magnitude;
(g) subtracting the second atom from the new data set to create a further new data set;
(h) repeating step (b) with the further new data set, and then re-applying steps (c) to (f); and
(i) outputting as quantized transform data coded versions of the atoms derived at steps (c) and (f).

According to another aspect there is provided a coder for data compression comprising means for applying a transform to time-varying data to generate a multi-dimensional transform data set, and a coder for coding the transform data set by applying a plurality of one-dimensional matching pursuits algorithms, one for each dimension.

According to another aspect there is provided a coder for data compression comprising:
(a) means for applying a transform to multi-dimensional data to generate a multi-dimensional transform data set;
(b) means for convolving the transform data set with each of a plurality of first one-dimensional basis functions to generate a corresponding plurality of convolved data sets;
(c) means for determining a location in a first direction across all the convolved data sets, and a first basis function representative of a greatest magnitude;
(d) means for convolving the transform data at the said location with each of a plurality of second one-dimensional basis functions;

(e) means for determining a second basis function representative of a greatest magnitude;
(f) means for representing part of the transform data surrounding the said location with an atom derived from the first and second basis functions corresponding to the greatest determined magnitudes;
(g) means for subtracting the atom from the transform data set to create a new data set;
(h) means for repeatedly updating the convolved data sets by convolving any changed part of the transform data set with each of the plurality of first one-dimensional basis functions; and
(i) means for outputting as quantized transform data coded versions of the derived atoms.

According to another aspect there is provided a coder for data compression comprising:
(a) means for applying a transform to multi-dimensional data to generate a multi-dimensional transform data set;
(b) means for convolving the transform data set with each of a plurality of first one-dimensional basis functions to generate a corresponding plurality of convolved data sets;
(c) means for determining a first location in a first direction across all the convolved data sets, and a first basis function representative of a greatest magnitude; and representing part of the transform data surrounding the first location with a first atom derived from the first function corresponding to the greatest determined magnitude;
(d) means for subtracting the first atom from the transform data set to create a new data set;
(e) means for convolving the new data set with each of a plurality of second one-dimensional basis functions;
(f) means for determining a second location in a second direction across all the convolved data sets, and a second basis function representative of a greatest magnitude; and representing part of the new data set surrounding a second location with a second atom derived from the second function corresponding to the greatest determined magnitude;
(g) means for subtracting the second atom from the new data set to create a further new data set;
(h) means for repeating step (b) with the further new data set, and then re-applying steps (c) to (f); and
(i) means for outputting as quantized transform data coded versions of the atoms derived at steps (c) and (f).

The invention further extends to a codec including a coder as previously described. It further extends to a computer program for carrying out the method described, and to a machine-readable data carrier which carries such a computer program.

In the preferred method, the transform consists of or includes a decorrelating transform and/or a frequency based transform.

In applying the matching pursuits algorithm, the mechanism for convolving the transform data set with each of the plurality of the bases is not critical. Typically, this may be achieved by calculating the inner product of each of the bases with every possible position (data point) in the transform data set. However, less accurate methods of locating the position may also be used. Likewise, the position where the inner product is greatest may be determined in any convenient way, for example by searching. Preferably, a small portion of the data around the relevant point is then represented by the basis function at that position multiplied by a coefficient which has the same sign as the selected inner product, and the square root of its magnitude.

The position having the greatest magnitude may be determined by taking the absolute magnitude (that is, relative to zero). Alternatively, the position of greatest magnitude may be determined after the application of a function across the data which may represent a sensory or psychophysical model such as a psychoacoustic or psychovisual model representative of the perceptual importance of the data. The function map may, but need not, define threshold values which are subtracted from the data before the position of greatest magnitude is determined. Alternatively, the function map may be used as a multiplier to the data, or combined with it in some other way.

The method of the present invention may be used to compress both two-dimensional data (for example still images), as well as three-dimensional data (for example moving images with some compression in the time dimension). When three-dimensional data is to be compressed, a two-dimensional transform may be used, followed by three one-dimensional matching pursuits algorithms.

In one embodiment of the invention, the whole or part of the transform data set (for example a sub-band of the data set) may be scanned in the direction in which the data is most correlated, and one-dimensional matching pursuits may be applied to the data so scanned.

The invention may be put into practice in a number of ways and several specific embodiments will now be described, by way of example, with reference to the accompanying drawings in which.

Before describing the specific embodiments in detail, it may be worth summarising the operation of the matching pursuits transform. Specifically, we will summarise the way in which a 2D transform may be used to compress a 2D block of data, such as a still image.

Matching pursuits in the 2D case uses a library of 2D basis functions, typically normalized Gabor functions although other functions are equally possible. To encode the image, the transform forms the inner product of all the bases with every possible data point. This is equivalent to convolving the data with each and every basis function. Locally, wherever the basis function resembles the data, peaks will occur within the inner product. The results are then searched for the basis function that gives the inner product of largest magnitude: we can then represent a small portion of the data by the basis function at that position, multiplied by a coefficient which has the same sign as the selected inner product and the square root of its magnitude.

This gives what is known as an "atom". The code for the atom is the amplitude and the position within the data set (e.g. image), along with the number of the corresponding basis function.

The atom just found is then subtracted from the image, giving a modified image which represents the so-far uncoded portion of the data. This process is then iteratively repeated, to find additional atoms. At each iteration, a search is carried out for the basis function that gives the inner product of largest magnitude. Of course, it is necessary to update the convolution only where subtraction of the basis function has changed them.

The atoms found at each iteration are simply summed to create the encoded version of the data. When sufficient atoms have been found to represent the original image at some desired level of fidelity, the resultant list of atoms constitutes the compressed code. This code can be arranged and entropy coded, if required, to reduce its size.

The one-dimensional matching pursuits transform is similar, except of course that the code book consists of 1D rather than 2D functions. 1D matching pursuits has been applied as a transform to raw audio data with promising results, although, as mentioned above, the fact that the transform is computationally intensive has until now severely limited its usability in practical real-time applications.

Figure 1:
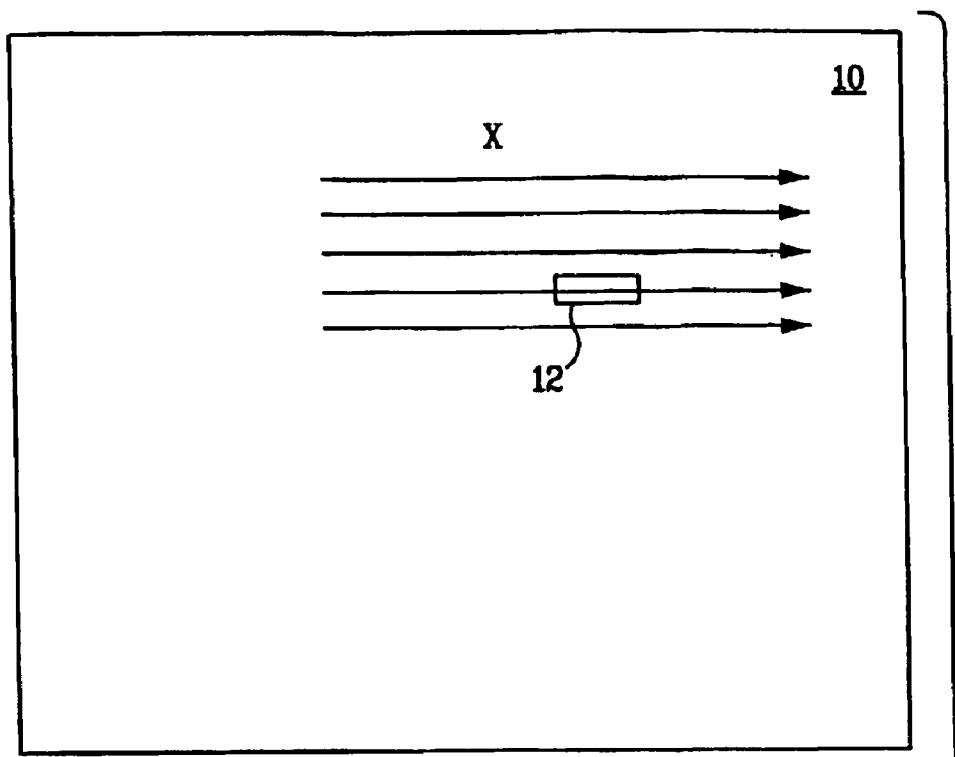
FIG. 1 illustrates a first embodiment of the present invention in which independent one-dimensional atoms are used.
Figure 1:
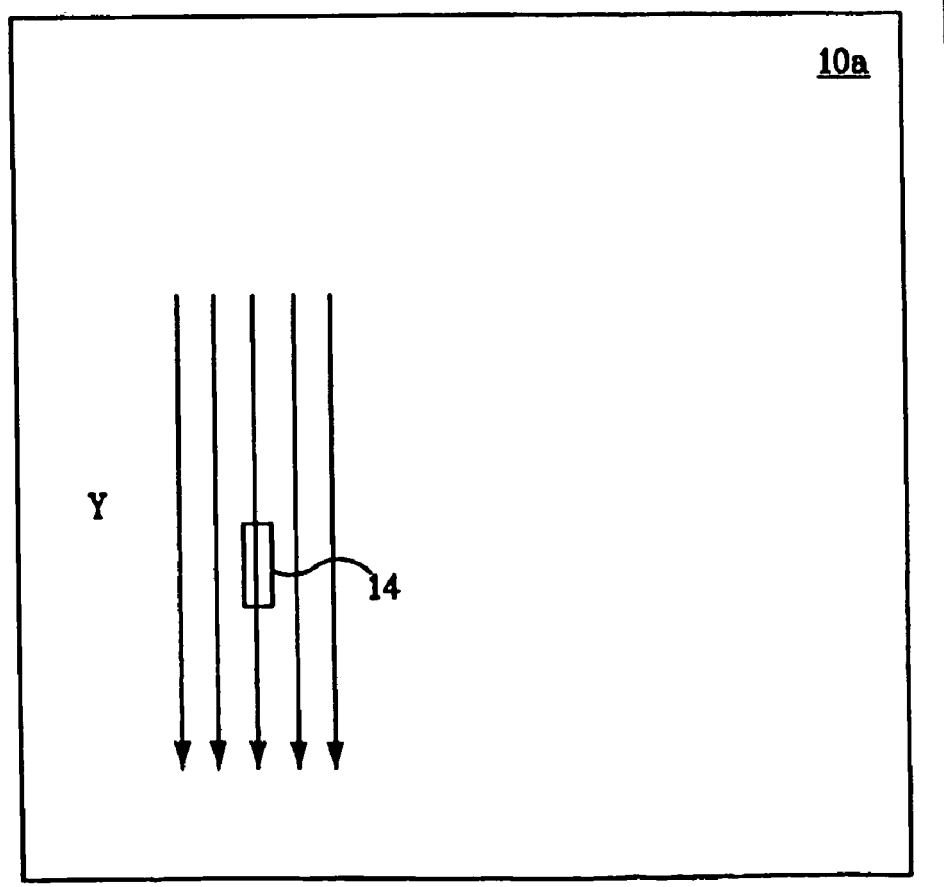

The operation of the invention according to a first embodiment is shown schematically in FIG. 1. Here, some sort of transform (preferably a frequency transform) has been applied to a multidimensional data set (not shown) to create a multidimensional transform data set 10. For the sake of illustration only, the data set 10 is a two-dimensional data set having axes x,y.

To apply matching pursuits to this data set, the data is raster-scanned in the x direction, and the location 12 is determined at which one finds an atom of greatest magnitude. Position, amplitude and code book entry are recorded. The atom just found is then subtracted—typically after quantization of the amplitude—from the transform data set 10 to create a modified data set 10a. Next, the data set 10a is raster scanned in the y direction and the process repeated to find the best y atom at the further location 14 (which may not be the same as location 12).

To encode a two-dimensional image, this process is simply repeated, with the scans being taken alternately in the x and in the y directions. While the scans are preferably orthogonal, it is not essential that they be horizontal and vertical, and in some applications it may be preferable to use alternating raster scans which go diagonally.

This embodiment may easily be extended to higher dimensional data sets. For example, a three-dimensional data set may be encoded with alternating x, y, z scans, with an appropriate one-dimensional atom being selected at each of the scans. When the data set is representative of a video stream in x, y, t, the same approach may be used with the t axis being treated in exactly the same way as the z axis above. In other words, the t axis may be treated as if it were an independent spatial axis. Time-varying three-dimensional data in x, y, z, t may also be treated in a similar way, with repeated scans being made in x, y, z, t, x, y, z, t and so on. As with the two-dimensional case, while it is preferred that the scans are made in mutually orthogonal directions, it is not essential for the axes to be those previously mentioned. In some embodiments, raster scanning across diagonal planes may be preferred.

The code book used for each one-dimensional scan may be unique, or alternatively the same code book may be used for scans in more than one direction. It may be desirable for a first code book to be used for scans in the spatial dimensions, and for a second code book to be used for scans in the time dimension.

It is not essential for each raster scanned to be taken over the entirety of the data set to be the encoded. Where desirable, the data set may be partitioned before scanning is undertaken, with the scans being carried out on each partition separately. The partition may be the spatial partition, a temporal partition, a frequency partition, or any other type of partition that may be convenient according to the type of data being processed and the particular transform that is in use. 1D scanning may be done in different directions in each region.

Figure 2:
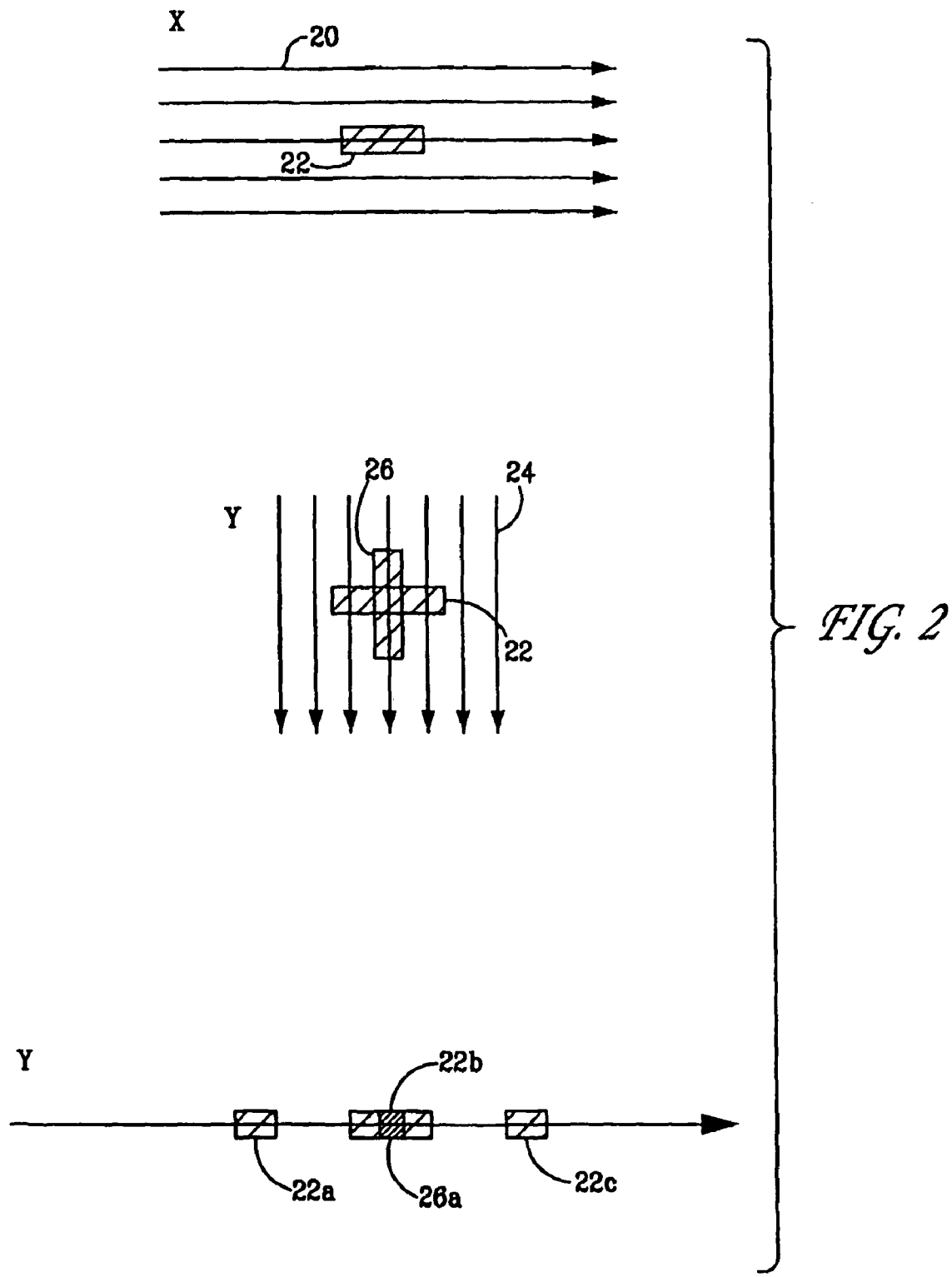
FIG. 2 illustrates a second embodiment in which two one-dimensional atoms are used to generate a two-dimensional atom.

An alternative and rather more sophisticated approach is shown in FIG. 2. Here, scanning is first carried out in the x direction 20 and the location 22 of the best-fitting x-atom 22 is determined as before. Next, an orthogonal scan 24 in the y direction is carried out, not across the whole data set but instead just locally in the region of the atom 22. At this location, the best y-atom is then selected. The x-atom and the y-atom together define a single (separable) two-dimensional transform. The amplitude is quantized, and the atom is subtracted from the data set to create a modified data set on which the procedure may be repeated. Because the second scan is taken in a direction orthogonal to the first, it will be understood that the location of the x-atom 22 becomes split up in the y-axis output stream as shown in the lower part of the figure at 22a, 22b, 22c. The "repair" of the data set following the subtraction therefore needs to be carried out at multiple places within the y-axis stream.

The same approach may be used in more than two dimensions. So, where the original data set is representative of a three-dimensional model in x, y, z, three separate one-dimensional scans may be used to generate a single 3D atom. Likewise, for encoding a video stream in x, y, t, the t-axis may simply be treated as a third spatial dimension to create a single 3D atom in x, y, t. Where a sequence of video images is to be encoded, a suitable transform is first applied, as discussed above, to create a three-dimensional transform data set (in space and time). Then, on the three-dimensional data set we carry out three matching pursuits separable searches, each in a different orthogonal direction. So, first, we may for example carry out a raster scan through the data in the x direction, using a first one-dimensional code book, and look for the best matched location for each atom within that code book. Once the best x atom and location have been found, we then use matching pursuits again, but this time looking in the y direction only and using a separate y-code book. It is not necessary to scan the entire data set again, in the y direction, as we have found that in practice restricting the y search to a small area at or very near the previously-identified best location can still provide good results while substantially reducing computational overhead.

Once the best y atom has been located, the process is repeated, this time using a one-dimensional code book based upon the time dimension. As before, the t search may be restricted to an area at or close to the best locations previously found in the x and/or y searches. It has been found in practice that the best results can be obtained by using separate matching pursuits code books for the x, y and t searches. However, where appropriate, a common code book may be used either just for the x and y directions, or for all three directions.

Once all three one-dimensional atoms have been identified, an entire three-dimensional block around the preferred location can then be reconstructed. We recompute (using the inner product) to reconstruct the adjusted data (including the amplitude, since the "amplitude" of each individual direction is not sufficient, in itself, to calculate the actual model amplitude).

The modelled data is then quantized and subtracted from the original data. A note is made of the three one-dimensional atoms for future reference, and the entire process is then repeated on the reduced data set. This continues until the data set has been reduced sufficiently, accordingly to the requirements of the particular application.

The same approach may be applicable to encode time-varying three-dimensional data, by means of single 4D atoms constructed from separable x, y, z and t atoms.

While the above sets out a variety of possible options, the most preferred implementation is as follows: after the multi-dimensional transform we simply scan the data in any desired 1D readout order. We then code the 1D scan with 1D Matching Pursuits.

This may be repeated by re-scanning in some other readout order (which may but need not be orthogonal to the first). Thus, we typically use one or more matching pursuits algorithms to a maximum of one per dimension of the data.

Where a wavelet transform has been used, the x code book may include atoms which define frequency, phase, attenuation, amplitude constant size; the y code book may define slew, attenuation, size and amplitude (frequency need not to be considered since that has already been decided); and the t code book may define time-slew, attenuation and size.

A convenient function that may be used to define the individual one dimensional atoms is the Gabor function. In the x direction, that is given by f(x), where:

$$F(x)=A \cos(\omega x+\Phi)e^{-\lambda t}$$

Similar Gabor functions G(y) and H(t) may be used for the y and t directions. It will be understood, of course, that the amplitude, phase shift and attenuation constants may be different in each of the three directions.

The three matches are not necessarily carried out in the order described above, and it may sometimes be sufficient or convenient to match in some other order, for example t, x, y, or x, t, y.

In the preferred embodiment, each 1D matching pursuit algorithm is implemented by calculating the inner product of each of the available bases with every considered position (data point) in the transform data set. The position where the inner product as the greatest absolute magnitude is then determined in any convenient way, for example by searching. As mentioned above, the second and third 1D matches do not require any searching in space at all, although in some circumstances it may be convenient to carry out a small 1D (or 2 or 3D) search in the vicinity of the 'best' location found by the previous matches Alternatively, instead of looking for the position having the greatest absolute magnitude (that is, relative to zero) some other measure of magnitude may be used instead. Where a model such as a psychoacoustic or a psychovisual model is in use, the position of greatest magnitude may be chosen with reference to that underlying model. One way of doing that is to apply the model as a weighting over the entire set of data before determining the position of greatest magnitude; alternatively, another approach is to view the model as defining thresholds, in which case the thresholds may be subtracted from the inner products following which the difference of greatest magnitude is sought. It will be understood, of course, that other approaches are possible. In general, a psychoacoustic, psychovisual or other model may be applied as a function map across the transform data set, with the position of greatest magnitude being located across the transformed data as modified by the mapped function.

In any of the embodiments described above, instead of alternating between scanning directions an approach we call "agile scanning" may be used instead. We start by scanning separately in each possible direction, and determining the best possible atom in each of those directions. The amplitude (magnitude) of each of those atoms of is stored. Next, we repeatedly scan the channel (direction) of the highest magnitude until that channel generates an atom having a magnitude which is less than that of the stored magnitude of one of the other channels. Then, we switch to the channel which currently contains the atom of greatest magnitude and repeatedly scan that in the same way. We switch again when that channel no longer generates an atom of highest magnitude.

If the most recently scanned channel generates an atom of an identical magnitude to one which has already been found in another channel, we prefer that the channels should be switched. Alternatively, however, it would equally be possible never to switch channels in such a situation.

This approach is particularly efficient, since it allows the encoder to concentrate on obtaining "quick gains" in one channel, and automatically to switch to another channel as soon as it becomes optimal to do so. Since the rules used are causal, the state of the encoder can continually be tracked by corresponding rules set up within the decoder without the need to transfer any status bits.

The preferred embodiments, described above, provide for the first time the promise of a full 3D matching pursuits video coder that does not require the use of motion vectors as in conventional motion compensated video coding. The need for motion vectors is effectively eliminated by the temporal aspect of the atoms. This has the effect of making fully-scalable video coding a real possibility for the first time.

Of course, it is by no means excluded that motion compensation may still be used when desired. In such an embodiment, applicable to both time-varying 2D and 3D data, once one or more spatial atoms have been determined, those atoms may then be copied into (or moved along) the time dimension by some prediction mechanism such as for example the use of motion vectors. This approach will now be discussed in more detail, with a view to illustrating how embodiments of the present invention may be incorporated within a motion-compensated codec.

To set the scene for these specific embodiments, we will next describe, briefly, some standard motion-compensated video compression techniques.

Video compression is divided into two basic categories: motion-compensated and non motion-compensated. When individual frames are compressed without reference to any other frames, the compression is described as "intra-coded". One of the advantages of intra-coded video is that there is no restriction on the editing which can be carried out on the image sequence. As a result, most digital video in the broadcasting industry is stored in this way at source. The intra-coding approach can be used in association with any of a large number of still image compression techniques such as, for example, the industry standard JPEG compression scheme. This approach is taken by the moving JPEG standard for video compression: JPEG compression is used for each of the individual frames, with each of the frames being handled independently and without reference to any other frame.

Video sequences are not, however, typically composed of a collection of entirely unrelated images, and greater compression can normally be obtained by taking account of the temporal redundancy in the video sequence. This involves a process known as inter-coded compression. With this approach, individual images in the output sequence may be defined with reference to changes that have occurred between that image and a previous image. Since the compressed data stream (sent across the video channel for reconstruction by the decoder) typically represents information taken from several frames at once, editing on the compressed data stream is not normally carried out because the quality is severely compromised.

Inter-coded compression is one of the compression techniques that is incorporated into the MPEG video compression standard.

Figure 3:
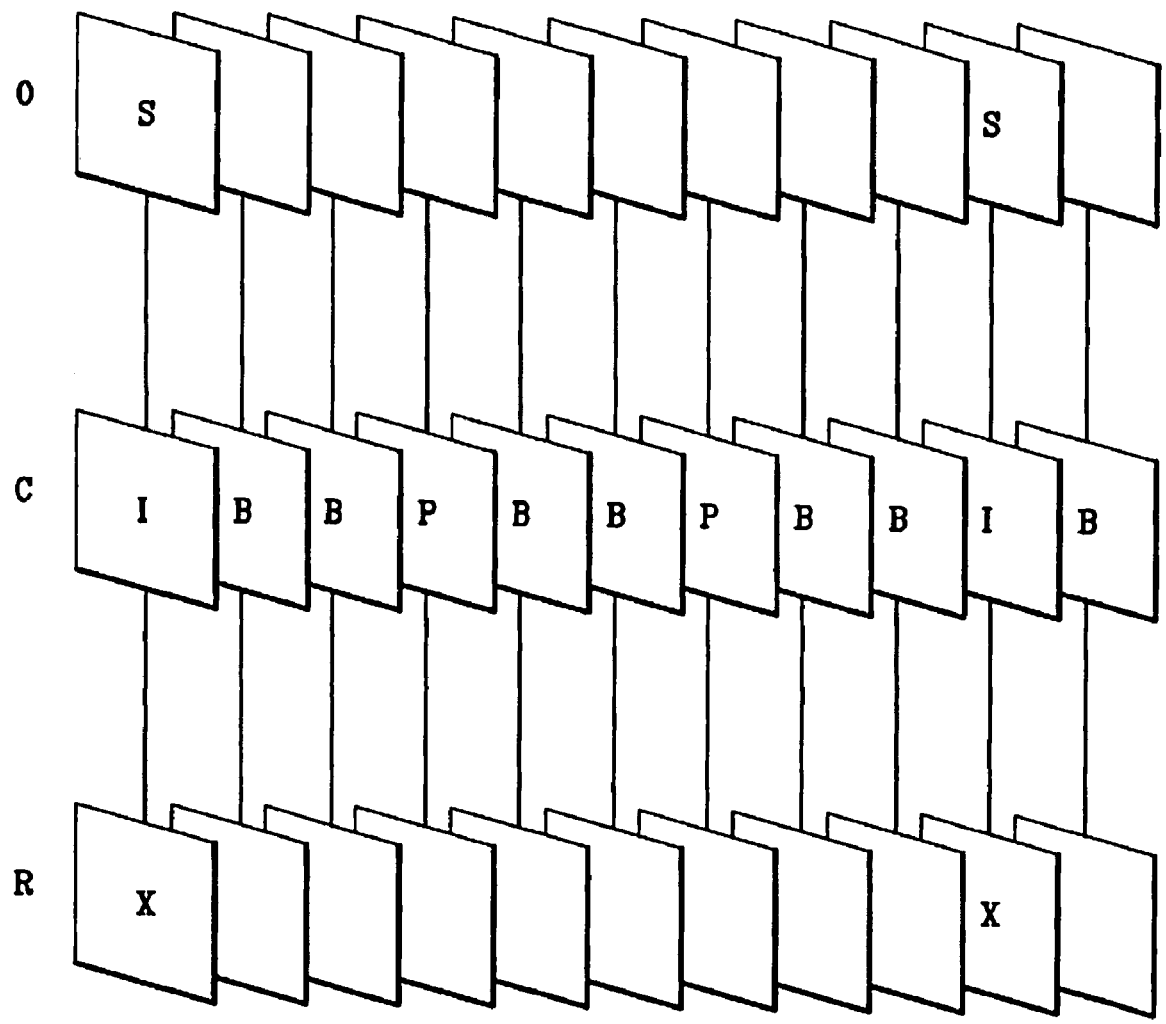
FIG. 3 illustrates a generic method of video coding.

A typical inter-coded compression scheme is shown schematically in FIG. 3. In that Figure, the upper row O represents the original digitised video frames that are to be compressed, the second row C represents the compressed images, and the bottom row R the residuals.

In the scheme shown, selected original frames S are treated as still images, and are compressed by any convenient method to produce intra-frames I. These frames are then used as reference frames to create predicted frames P. The contents of these frames are projected from one or more I frames—either forwards or backwards in the sequence. This is normally achieved by the use of motion vectors, associated with moving blocks within the image. Alternatively, the movement of specific physical objects within the image may be determined and predicted. Finally, the C sequence is completed by generating interpolated frames B between the P and I frames. The original video sequence can then be approximated by the sequential frames of the C sequence, namely the I, B and P frames. In practice, further corrections normally have to be made if the end result is to appear reasonable. These further corrections are achieved by determining a residual frame R corresponding, in each case, to the difference between the original frame and the corresponding compressed frame. Residual frames may, but need not, be calculated for the intra frames. Accordingly, the residual frames marked X may sometimes be omitted.

In a practical embodiment, an encoder calculates the I frames from the these original frames labelled S in the diagram, and, from that, calculates the motion parameters (vectors) that are needed to define the P frames. The data stream transmitted from the encoder to the decoder thus includes the encoded I frames and the appropriate motion vectors enabling the decoder to construct the P frames. Information on the B frames is not sent, since those can be reconstructed by the decoder alone purely on the basis of the information within the I and P frames. In order to improve the final result, the data stream also includes the residual images, sent on a frame by frame basis. Since the residual image represents the difference between the original image and the compressed image, the encoder needs to have access to the sequence of compressed images. That is achieved by incorporating an additional decoder within the encoder.

The final data stream, as sent, therefore includes the full I frames, the motion vectors for the P frames and all of the residual frames possibly excluding those that are labelled X in FIG. 1. Each residual image is typically compressed before transmission.

Numerous transforms, including matching pursuits, are known in the art for compressing the original S frames to produce the Intra frames. It has also been suggested, in the Neff and Zachor paper mentioned previously, that matching pursuits may be used to encode the residual images.

Figure 4:
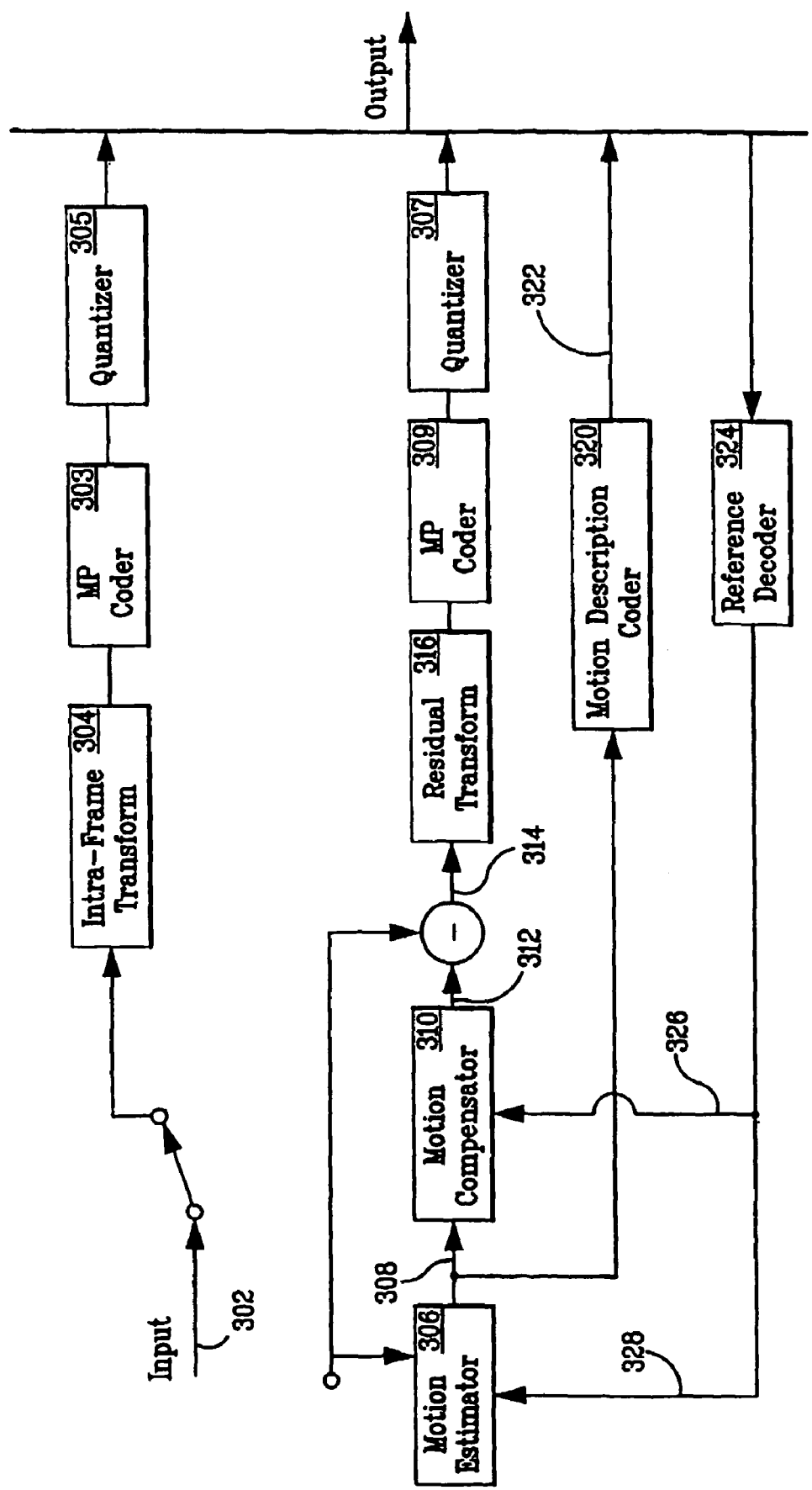
FIG. 4 shows in schematic form a video coder according to an embodiment of the present invention.

In contrast, in the preferred embodiment, the raw images are transformed by means of any standard transform, and the output of the transform is then quantized using the matching pursuits algorithm. The same applies to any residual images: instead of applying matching pursuits as a transform to the residual image, the residual image is instead first transformed using a standard transform, and the output of that transform is then quantized using matching pursuits. In both cases, the initial transform which operates on the data itself may for example be an FFT, a wavelet transform, a DCT or a lapped orthogonal transform. Other transforms could also be used.

Where motion vectors are to be used, the methods discussed above may be incorporated within a motion-compensated hardware or software encoder, as shown in FIG. 4, although as previously mentioned motion vector compensation is not necessarily required at all in the present invention.

As shown in FIG. 4, frame by frame input is applied at an input 302, with the intra-frame data being passed to an intra-frame transform 304 and then to a matching pursuits coder or atom finder 303. The atom the amplitude is then quantized at 305. The inter-frame data is passed to a motion estimator 306 which provides a parametised motion description on line 308, this then being passed to a motion compensator 310. The motion compensator outputs a predicted frame along a line 312 which is subtracted from the input frame to provide a residual frame 314 which is passed to a residual transform 316. The transform output is applied to a matching pursuits coder 309 and then to a quantizer 307 which outputs quantized codes to the output stream.

The motion description on line 308 is also passed to a motion description coder 320, which codes the description and outputs motion data on a line 322.

The output stream thus consists of coded intra-frame data, residual data and motion data.

The output stream is fed back to a reference decoder 324 which itself feeds back a reference frame (intra or inter) along lines 326, 328 respectively to the motion compensator and the motion estimator. In that way, the motion compensator and the motion estimator are always aware of exactly what has just been sent in the output stream. The reference decoder 324 may itself be a full decoder, for example as illustrated in FIG. 5.

Generally, the motion vectors may be derived by comparing a successor frame with the decompressed previous frame; in the alternative, the original previous frame could be used. In either case, the residual frames are calculated as the difference between the predicted frame and the original successor frame. In a variation (not shown) of the embodiment, the frames being compared might be pre- to improve the motion vectors.

Figure 5:
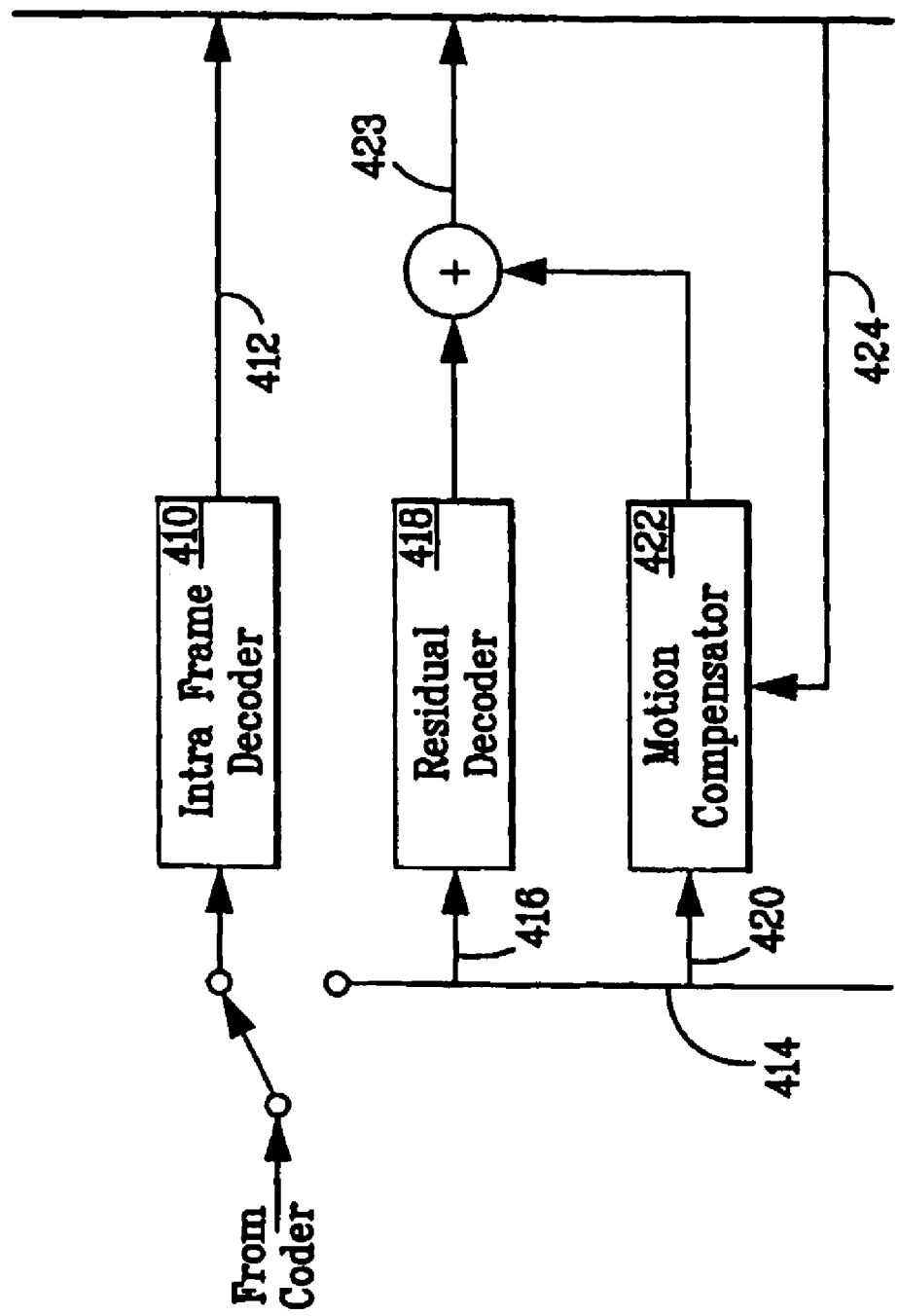
FIG. 5 shows a decoder corresponding to the encoder of FIG. 2.

The output stream travels across a communications network and, at the other end, is decoded by a decoder which is shown schematically in FIG. 5. The intra-information in the data stream is supplied to an intra-frame decoder 410, which provides decoded intra-frame information on a line 412. The inter-information is supplied to a bus 414. From that bus, the residual data is transmitted along a line 416 to a residual decoder 418. Simultaneously, the motion data is supplied along a line 420 to a motion compensator 422. The outputs from the residual decoder and the motion compensator are added together to provide a decoded inter-frame on line 423.

Reference frame information is fed back along a line 424 to the motion compensator, so that the motion compensator always has current details of both the output from and the input to the decoder.

It will be understood of course that the invention is not restricted to use with the type of motion-compensated video coder as shown in FIG. 4: it may be used in any type of video coder, where the output from the main transform needs to be quantized.

This approach may be used not only for video compression, as previously described, but also for still image compression.

Figure 6:
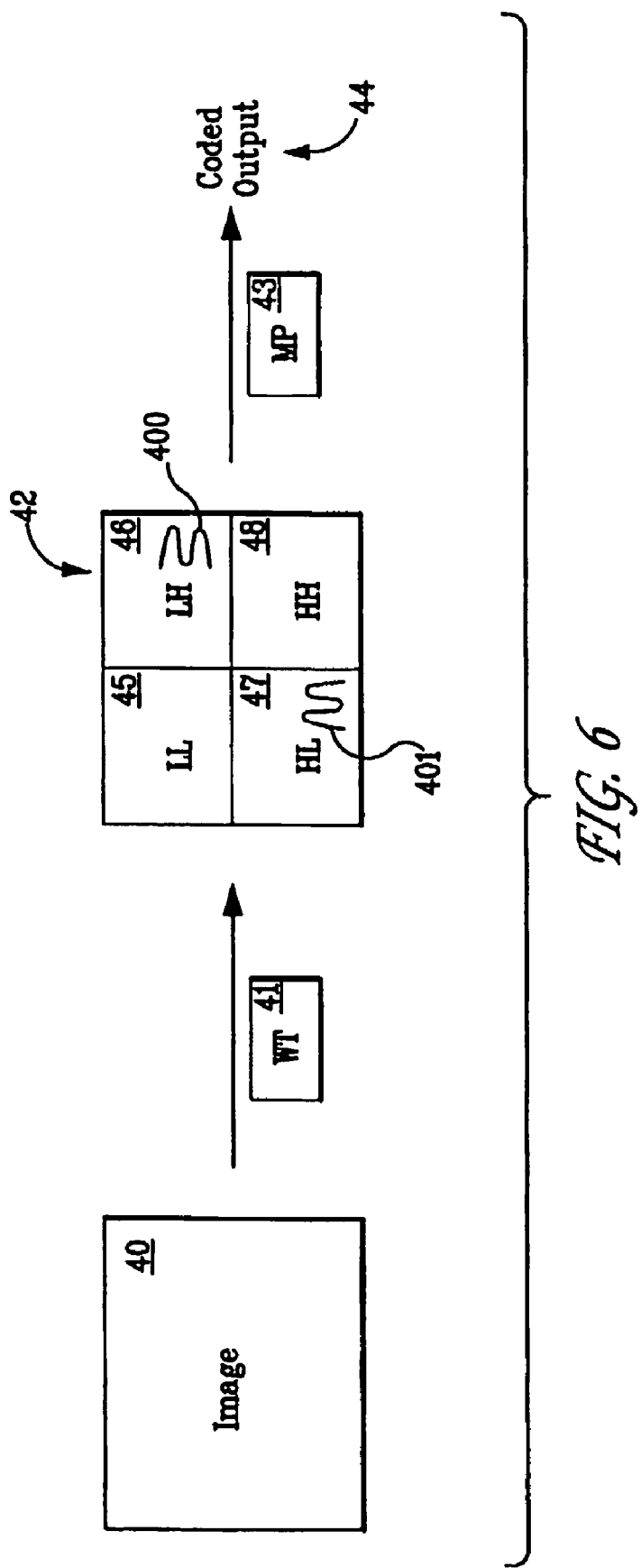
FIG. 6 illustrates an application of matching pursuits to the two-dimensional output of a wavelet transform.

A further embodiment, in which the raw input data is for example representative of a still image, is shown in FIG. 6. Here, the input data/image 40 is first transformed/compressed in some way (e.g. by means of a wavelet transform 41), to produce a transformed image 42. That image is then quantized by means of a matching pursuits coder and quantizer 43 to produce the final coded output 44.

The wavelet transform 41 could be replaced with any other convenient compression transform such as an FFT a DCT, or a Lapped Orthogonal transform.

In the example shown in FIG. 6, the image 40 undergoes a wavelet transform which splits the image up into several spatially-filtered sections or sub-bands 45, 46, 47, 48. Sections 46 and 47 have been highpass filtered in one direction and low pass filtered in another, which means that those two sub-bands are better decorrelated in one direction than in the other. It will be understood, of course, that a horizontal transform could be followed by a vertical, or vice versa. After raster scanning those sub-bands as indicated by the reference numerals 400, 401, a one-dimensional matching pursuits quantization is then used. A fairly small matching pursuits code book may be used, for each direction, since the finding of structure within the image at different scales has already been automatically carried out by the wavelet transform: that no longer needs to be carried out by the matching pursuits algorithm.

The use of 1D matching pursuits algorithms to quantize the output of a 2D transform is applicable not only to wavelet transforms but to any other 2D transforms which decorrelate better in one direction than in another (at least over part of the area of the output). Generally, the output of the transform may automatically divide the data up into a number of different partitions, and the partitions may then be individually scanned, each in a separate preferred direction.

It is envisaged that the matching pursuits algorithm may be applied to the output of any multi-dimensional decorrelating transform, preferably a frequency transform.

What is claimed:

1. A method of data compression comprising:
   applying by one or hardware encoders a transform to multi-dimensional data to generate a multi-dimensional transform data set; and
   coding by the one or hardware encoders the transform data set by applying one or more one-dimensional matching pursuits algorithms,
   wherein the algorithms are applied by sequential one-dimensional scans through the data, and wherein successive scans continue in the same direction until an atom is located of lower magnitude than atoms which have previously been located in scans in other directions, and in which the scan direction is then changed.

2. A method of data compression comprising:
   (a) applying by one or hardware encoders a transform to multi-dimensional data to generate a multi-dimensional transform data set;
   (b) convolving by the one or hardware encoders the transform data set with each of a plurality of first one-dimensional basis functions to generate a corresponding plurality of convolved data sets;
   (c) determining by the one or hardware encoders a location in a first direction across all the convolved data sets, and a first basis function, representative of a greatest magnitude;
   (d) representing by the one or hardware encoders part of the transform data surrounding the said location with an atom derived from the first basis function corresponding to the greatest determined magnitude;
   (e) subtracting by the one or hardware encoders the atom from the transform data set to create a new data set;
   (f) repeatedly updating by the one or hardware encoders the convolved data sets by convolving any changed part of the transform data set with each of the plurality of first one-dimensional basis functions, and then re-applying steps (c) and (d); and
   (g) outputting by the one or hardware encoders as transform data coded versions of the atoms derived at step (d), wherein the data to be compressed represents video image data, wherein the transform decorrelates at least part of the transform data set better in one direction than in a perpendicular direction, and wherein a first algorithm is applied by carrying out a one-dimensional scan in a direction of greatest correlation.

3. A method of data compression as claimed in claim 2 in which the coded version of each atom includes magnitude, position in transform data set and number of basis function.

4. A method of data compression as claimed in claim 1, in which the data to be compressed represents video image data.

5. A method of data compression as claimed in claim 1 in which the data to be compressed represents a still image.

6. A method of data compression as claimed in claim 1 in which the data to be compressed comprises residual images within a motion compensated video coder.

7. A method of data compression as claimed in claim 1 in which one dimension of the transform data set represents time.

8. A method of data compression as claimed in claim 1 in which the transform is a frequency-separating transform.

9. A method of data compression as claimed in claim 8 in which the transform decorrelates at least part of the transform data set better in one direction than in a perpendicular direction, and in which a first algorithm is applied by carrying out a one-dimensional scan in the direction of greatest correlation.

10. A method of data compression as claimed in claim 1 in which the transform is two-dimensional.

11. A method of data compression as claimed in claim 1 in which the scan direction is changed to that direction in which an atom of highest current magnitude has previously been located.

12. A method as claimed in claim 2 including applying a function map to the convolved data sets before determining the location of greatest magnitude.

13. A method as claimed in claim 12 in which the function map represents a sensory model.

14. A method as claimed in claim 12 in which the function map represents a psychoacoustic model.

15. A method as claimed in claim 12 in which the function map represents a psychovisual model.

16. A method as claimed in-claim 12 in which the function map is multiplicatively applied.

17. A method as claimed in-claim 12 in which the function map is additively or subtractively applied.

18. A method as claimed in claim 2 including the further steps of:
   (c1) convolving the transform data at the said location with each of a plurality of second one-dimensional basis functions;
   (c2) determining a second basis function representative of a greatest magnitude; and including, at step (d), representing part of the transform data surrounding the said location with an atom derived both from the first and from the second basis functions corresponding to the greatest determined magnitudes.

19. A method as claimed in claim 18 in which the second one-dimensional basis functions extend in the time domain.

20. A method as claimed in claim 2, including the additional steps of:
   (a) convolving the transform data at the said location with each of a plurality of third one-dimensional basis functions; and
   (b) determining a third basis function of a greatest magnitude;

and in which the atom is further derived from the third basis function corresponding to the greatest determined magnitude.

21. A method as claimed in claim 18, in which the second basis function representative of the greatest magnitude is determined without further searching in the region of the said location.

22. A method as claimed in claim 18, in which the second basis function representative of the greatest magnitude is determined at least partly by searching a local area in the region of the said location.

23. A method of data compression comprising:
(a) applying by one or hardware encoders a transform to multi-dimensional data to generate a multi-dimensional transform data set;
(b) convolving by the one or hardware encoders the transform data set with each of a plurality of first one-dimensional basis functions to generate a corresponding plurality of convolved data sets;
(c) determining by the one or hardware encoders a first location in a first direction across all the convolved data sets, and a first basis function representative of a greatest magnitude; and representing by the one or hardware encoders part of the transform data surrounding the first location with a first atom derived from the first basis function corresponding to the greatest determined magnitude;
(d) subtracting by the one or hardware encoders the first atom from the transform data set to create a new data set;
(e) convolving by the one or hardware encoders the new data set with each of a plurality of second one-dimensional basis functions;
(f) determining by the one or hardware encoders a second location in a second direction across all the convolved data sets, and a second basis function representative of a greatest magnitude; and representing by the one or hardware encoders part of the new data set surrounding the second location with a second atom derived from the second basis function corresponding to the greatest determined magnitude;
(g) subtracting by the one or hardware encoders the second atom from the new data set to create a further new data set;
(h) repeating by the one or hardware encoders step (b) with the further new data set, and then re-applying steps (c) to (f); and
(i) outputting by the one or hardware encoders as quantized transform data coded versions of the atoms derived at steps (c) and (f),
wherein the second basis function representative of the greatest magnitude is determined without further searching in the region of the second location.

24. A method of data compression as claimed in claim 23 in which the first location and the second location are coincident.

25. A hardware coder for data compression comprising:
a processor;
means for applying a transform to multi-dimensional data to generate a multi-dimensional transform data set; and
means for coding the transform data set by applying one or more one-dimensional matching pursuits algorithms,
wherein the transform is a frequency-separating transform, and wherein the transform decorrelates at least part of the transform data set better in one direction than in a perpendicular direction, and in which a first algorithm is applied by carrying out a one-dimensional scan in a direction of greatest correlation.

26. A hardware coder for data compression comprising:
(a) means for applying a transform to multi-dimensional data to generate a multi-dimensional transform data set;
(b) means for convolving the transform data set with each of a plurality of first one-dimensional basis functions to generate a corresponding plurality of convolved data sets;
(c) means for determining a location in a first direction across all the convolved data sets, and a first basis function representative of a greatest magnitude;
(d) means for representing part of the transform data surrounding the said location with an atom derived from the first basis function corresponding to the greatest determined magnitude;
(e) means for subtracting the atom from the transform data set to create a new data set;
(f) means for repeatedly updating the convolved data sets by convolving any changed part of the transform data set with each of the plurality of first one-dimensional basis functions;
(g) means for outputting as transform data coded versions of the derived atoms; and
(h) a processor,
wherein the data to be compressed represents video image data, wherein the transform decorrelates at least part of the transform data set better in one direction than in a perpendicular direction, and wherein a first algorithm is applied by carrying out a one-dimensional scan in a direction of greatest correlation.

27. A hardware coder for data compression as claimed in claim 26 including:
(c1) means for convolving the transform data at the said location with each of a plurality of second one-dimensional basis functions; and
(c2) means for determining a second basis function representative of a greatest magnitude;
and in which the means for representing part of the transform data further operates upon the second basis function.

28. A hardware coder for data compression comprising:
a processor;
means for applying a transform to multi-dimensional data to generate a multi-dimensional transform data set; and
means for coding the transform data set by applying one or more one-dimensional matching pursuits algorithms,
wherein the algorithms are applied by sequential one-dimensional scans through the data, and wherein successive scans continue in the same direction until an atom is located of lower magnitude than atoms which have previously been located in scans in other directions, and in which the scan direction is then changed.

29. A hardware coder for data compression comprising:
(a) means for applying a transform to multi-dimensional data to generate a multi-dimensional transform data set;
(b) means for convolving the transform data set with each of a plurality of first one-dimensional basis functions to generate a corresponding plurality of convolved data sets;
(c) means for determining a first location in a first direction across all the convolved data sets, and a first basis function representative of a greatest magnitude; and representing part of the transform data surrounding the first location with a first atom derived from the first basis function corresponding to the greatest determined magnitude;
(d) means for subtracting the first atom from the transform data set to create a new data set;

(e) means for convolving the new data set with each of a plurality of second one-dimensional basis functions;
(f) means for determining a second location in a second direction across all the convolved data sets, and a second basis function representative of a greatest magnitude; and representing part of the new data set surrounding the second location with a second atom derived from the second basis function corresponding to the greatest determined magnitude;
(g) means for subtracting the second atom from the new data set to create a further new data set;
(h) means for repeating step (b) with the further new data set, and then re-applying steps (c) to (f);
(i) means for outputting as transform data coded versions of the atoms derived at steps (c) and (f); and
(j) a processor,
wherein the second basis function representative of the greatest magnitude is determined without further searching in the region of the second location.

30. A hardware codec including a decoder and a coder as claimed in claim 25.

31. A non-transitory machine-readable medium having stored thereon instructions for carrying out a method as claimed in claim 1.

32. A method as claimed in claim 18 in which the second one-dimensional basis functions extend in the spatial domain.

33. A method of data compression as claimed in claim 2 in which the data to be compressed represents a still image.

34. A method of data compression as claimed in claim 3 in which the data to be compressed represents a still image.

35. A method of data compression as claimed claim 2 in which the data to be compressed comprises residual images within a motion compensated video coder.

36. A method of data compression as claimed claim 3 in which the data to be compressed comprises residual images within a motion compensated video coder.

37. A method of data compression as claimed in claim 2 in which one dimension of the transform data set represents time.

38. A method of data compression as claimed in claim 3 in which one dimension of the transform data set represents time.

39. A method of data compression as claimed in claim 2 in which the transform is a frequency-separating transform.

40. A method of data compression as claimed in claim 3 in which the transform is a frequency-separating transform.

41. A method as claimed in claim 13 in which the function map is multiplicatively applied.

42. A method as claimed in claim 14 in which the function map is multiplicatively applied.

43. A method as claimed in claim 15 in which the function map is multiplicatively applied.

44. A method as claimed in claim 13 in which the function map is additively or subtractively applied.

45. A method as claimed in claim 14 in which the function map is additively or subtractively applied.

46. A method as claimed in claim 15 in which the function map is additively or subtractively applied.

47. A method as claimed in claim 16 in which the function map is additively or subtractively applied.

48. A hardware codec including a decoder and a coder as claimed in claim 26.

49. A hardware codec including a decoder and a coder as claimed in claim 27.

50. A hardware codec including a decoder and a coder as claimed in claim 28.

51. A hardware codec including a decoder and a coder as claimed in claim 29.

52. A non-transitory machine-readable medium having stored thereon instructions for carrying out a method as claimed in claim 2.

53. A non-transitory machine-readable medium having stored thereon instructions for carrying out a method as claimed in claim 23.

* * * * *

UNITED STATES PATENT AND TRADEMARK OFFICE
CERTIFICATE OF CORRECTION

| | |
|---|---|
| PATENT NO. | : 7,889,933 B2 |
| APPLICATION NO. | : 10/585497 |
| DATED | : February 15, 2011 |
| INVENTOR(S) | : Monro |

It is certified that error appears in the above-identified patent and that said Letters Patent is hereby corrected as shown below:

Title Page 2, item (56), under "Other Publications", in Column 2, Line 18, delete "Confererice" and insert -- Conference --.

Column 12, line 44, in Claim 16, delete "in-claim" and insert -- in claim --.

Column 12, line 46, in Claim 17, delete "in-claim" and insert -- in claim --.

Column 15, line 31, in Claim 35, delete "claimed" and insert -- claimed in --.

Column 15, line 34, in Claim 36, delete "claimed" and insert -- claimed in --.

Signed and Sealed this
Twenty-first Day of August, 2012

David J. Kappos
*Director of the United States Patent and Trademark Office*